United States Patent
Wu et al.

(10) Patent No.: US 8,374,019 B2
(45) Date of Patent: Feb. 12, 2013

(54) PHASE CHANGE MEMORY WITH FAST WRITE CHARACTERISTICS

(75) Inventors: Chao-I Wu, Hsinchu (TW); Yen-Hao Shih, Elmsford, NY (US); Ming-Hsiu Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 177 days.

(21) Appl. No.: 12/985,253

(22) Filed: Jan. 5, 2011

(65) Prior Publication Data

US 2012/0170359 A1    Jul. 5, 2012

(51) Int. Cl.
G11C 11/00        (2006.01)
(52) U.S. Cl. .......................... 365/148; 365/158; 365/163
(58) Field of Classification Search ................... 365/148, 365/163, 158
See application file for complete search history.

(56) References Cited

U.S. PATENT DOCUMENTS

| | | | |
|---|---|---|---|
| 3,922,648 A | 11/1975 | Buckley | |
| 4,225,946 A | 9/1980 | Neale et al. | |
| 4,228,524 A | 10/1980 | Neale et al. | |
| 6,762,952 B2 | 7/2004 | Munden et al. | |
| 6,768,665 B2 | 7/2004 | Parkinson et al. | |
| 6,781,906 B2 | 8/2004 | Perner et al. | |
| 7,085,154 B2 | 8/2006 | Cho et al. | |
| 7,190,607 B2 | 3/2007 | Cho et al. | |
| 7,289,351 B1 | 10/2007 | Chen et al. | |
| 7,505,330 B2 | 3/2009 | Pawlowski et al. | |
| 7,539,050 B2 | 5/2009 | Philipp et al. | |
| 7,558,105 B2 | 7/2009 | Suh | |
| 7,571,901 B2 | 8/2009 | Philipp | |
| 7,577,024 B2 | 8/2009 | Fackenthal et al. | |
| 7,580,277 B2 | 8/2009 | Fuji | |
| 7,656,701 B2 | 2/2010 | Lee et al. | |
| 7,679,954 B2 | 3/2010 | Lee et al. | |
| 7,751,227 B2 | 7/2010 | Fuji | |
| 7,764,533 B2 | 7/2010 | Breitwisch et al. | |
| 7,767,993 B2 | 8/2010 | Toda et al. | |
| 7,796,424 B2 | 9/2010 | Happ et al. | |
| 7,826,248 B2 | 11/2010 | Xi et al. | |
| 7,830,701 B2 | 11/2010 | Siau et al. | |
| 7,903,457 B2 * | 3/2011 | Lung | 365/163 |
| 8,036,014 B2 * | 10/2011 | Lee et al. | 365/148 |
| 8,064,248 B2 * | 11/2011 | Lung | 365/163 |
| 8,107,283 B2 * | 1/2012 | Chen | 365/163 |
| 8,125,817 B2 * | 2/2012 | Takagi et al. | 365/148 |
| 2005/0275433 A1 | 12/2005 | Lee | |
| 2006/0034112 A1 | 2/2006 | Oh et al. | |
| 2007/0140029 A1 | 6/2007 | Kim et al. | |
| 2008/0019170 A1 | 1/2008 | Happ et al. | |
| 2008/0191187 A1 | 8/2008 | Lung et al. | |
| 2009/0273968 A1 | 11/2009 | Lamorey et al. | |
| 2010/0046285 A1 | 2/2010 | Lung | |
| 2010/0084624 A1 | 4/2010 | Lung et al. | |
| 2010/0214829 A1 | 8/2010 | Breitwisch et al. | |
| 2010/0314601 A1 | 12/2010 | Lee | |
| 2010/0328995 A1 | 12/2010 | Shih et al. | |
| 2010/0328996 A1 | 12/2010 | Shih et al. | |
| 2011/0013446 A1 | 1/2011 | Lung | |
| 2011/0116309 A1 | 5/2011 | Lung | |

* cited by examiner

*Primary Examiner* — Pho M Luu
(74) *Attorney, Agent, or Firm* — Haynes Beffel & Wolfeld LLP

(57) ABSTRACT

A memory device including programmable resistance memory cells, including electrically pre-stressed target memory cells. The pre-stressed target memory cells have one of a lower voltage transition threshold, a shorter duration set interval and a longer reset state retention characteristic. Biasing circuitry is included on the device configured to control the pre-stressing operations, and to apply read, set and reset operations that can be modified for the pre-stressed memory cells.

23 Claims, 13 Drawing Sheets

PHASE CHANGE MEMORY WITH FAST WRITE CHARACTERISTICS

PARTIES TO A JOINT RESEARCH AGREEMENT

International Business Machines Corporation, a New York corporation, and Macronix International Corporation, Ltd., a Taiwan corporation, are parties to a Joint Research Agreement.

BACKGROUND OF THE INVENTION

1. Field of the Invention

The present invention relates to memory devices including phase change-based memory materials, including chalcogenide-based materials and other programmable resistance materials, and methods for manufacturing such devices.

2. Description of Related Art

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity. These materials are the basis for integrated circuit phase change memory devices, and other memory technologies.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous state.

The magnitude of the current needed for reset can be reduced by reducing the size of the phase change material element in the cell and/or the contact area between electrodes and the phase change material, such that higher current densities are achieved with small absolute current values through the phase change material element.

Research has progressed to provide memory devices that operate with low reset current by adjusting a doping concentration in phase change material, and by providing structures with very small dimensions. One problem with very small dimension phase change devices involves endurance. Specifically, the resistance of memory cells made using phase change materials in a set state can drift as the composition of the phase change material slowly changes with time over the life of the device. Co-pending U.S. patent application entitled DIELECTRIC MESH ISOLATED PHASE CHANGE STRUCTURE FOR PHASE CHANGE MEMORY, U.S. application Ser. No. 12/286,874 (now U.S. Patent Publication No. 2010-0084624), filed 2 Oct. 2008 (MXIC 1849-1), addresses some of the issues discussed above related to changes in composition of the phase change memory during the first few cycles operation. U.S. application Ser. No. 12/286,874 is incorporated by reference as if fully set forth herein. Also, composite doping has been described as a technology for stabilizing phase change materials, in co-pending U.S. patent application Ser. No. 12/729,837, entitled PHASE CHANGE MEMORY HAVING ONE OR MORE NON-CONSTANT DOPING PROFILES, filed 23 Mar. 2010 (MXIC 1911-2), which is incorporated by reference as if fully set forth herein.

This drift can cause problems with reliability and increase in complexity of control circuitry needed to operate the devices. For example, if the resistance drifts on set or/and reset state cells, phase change speed changes, the dynamic resistance of the cells may change, different retention behaviors (resistance stability) are encountered, and so on. One result of these problems is that the sensing circuitry required on the devices must handle wider ranges of resistance for each of the memory states, which typically results in lower speed operation. Also, the set and reset processes must account for varying bulk conditions of the memory cells even within a single memory state, which typically results in uneven set and reset speeds across the array.

Co-inventor Ming-Hsiu Lee has described in co-pending U.S. patent application Ser. No. 12/484,955, filed 15 Jun. 2010 (MXIC 1879-1), a memory device having a phase change material element with a modified stoichiometry in the active region, which does not exhibit the drift in set state resistance of prior art memory devices. U.S. patent application Ser. No. 12/484,955 is incorporated by reference as if fully set forth herein. Also, a method for manufacturing the memory device is described in U.S. patent application Ser. No. 12/484,955 that includes first manufacturing an integrated circuit including an array of phase change memory cells with bodies of phase change material having a bulk stoichiometry; and then applying forming current to the phase change memory cells in the array to change the bulk stoichiometry in active regions of the bodies of phase change material to the modified stoichiometry, the modified stoichiometry being different than the bulk stoichiometry, and without disturbing the bulk stoichiometry outside the active regions. The bulk stoichiometry is characterized by stability under the thermodynamic conditions outside the active region, while the modified stoichiometry is characterized by stability under the thermodynamic conditions inside the active region. By establishing the bulk and modified stoichiometry in the memory element, the set state resistance of the memory cell is stabilized over the lifetime of the cell, which can extend to millions of set/reset cycles and more. The body of phase change material used as a memory element adopts a stabilized microstructure in which the stoichiometry is non-uniform, having a different atomic concentration profile in the active region than is found outside the active region of the body of phase change material. The transition in stoichiometry of the body of phase change material is not abrupt, but rather occurs across a transitional zone along the boundaries of the active region. The transitional zone characteristics will vary according to the structure of the memory cell, the type of forming current applied, and other factors. The term "stoichiometry" as used here refers to the quantitative relationship in atomic concentration between two or more substances in the phase change material in a volume measurable, for example, using energy dispersive x-ray spectroscopy (EDX), or equivalent techniques.

In addition to the issues discussed above, the write bandwidth of phase change memory is one characteristic that can limit the types of memory mission functions for which it can be used in an integrated circuit. The write bandwidth for this kind of memory is limited by the set operation speed rather than reset. This is because the set time is 5 to 10 times greater than that of the reset. However, the set current amplitude is 50%~70% of the reset.

In general, system-on-chip (SOC) technology is the integration of multiple subsystems of an electronic system within a single integrated circuit, and may contain digital, analog, mixed-signal, and radio-frequency functions. The various types of subsystems that may be integrated within the integrated circuit include microprocessor and microcontroller cores, digital signal processors (DSPs), configurable logic units, memory blocks, timing sources, external interfaces, and power management circuits, among others. An SOC consists of both the hardware described above, as well as the software that controls the subsystems. The term "system-on-a-chip" may be used to describe complex application specific integrated circuits (ASIC), where many functions previously achieved by combining multiple integrated circuits on a board are now provided by one single integrated circuit. This level of integration greatly reduces the size and power consumption of the system, while generally also reducing manufacturing costs.

In order to fulfill the memory performance requirements for the various functions of the SOC, different types of memory circuits serving different purposes of mission functions are typically embedded at various locations in the integrated circuit for memory applications such as random access memory (RAM), flash memory, and read only memory (ROM). However, integration of different types of memory devices for the various memory applications in an SOC can be difficult and result in highly complex designs and manufacturing processes.

Accordingly, it is desirable to provide a memory cell structure having more stable operation over the life of the device, and to provide for higher speed operations.

It is also desirable to provide memory on a single integrated circuit addressing different memory performance requirements such as those demanded of the various functions of SOCs, while also addressing the issue of design integration. It is also desirable to provide methods for manufacturing such devices.

It is also desirable to provide a memory technology that can be adapted for use in many mission functions.

SUMMARY OF THE INVENTION

An integrated circuit as described herein comprises a plurality of memory cells on a substrate. At least some of the memory cells have been subjected to a pre-stress process that alters the set speed of the cells in the array. As a result of the pre-stress process, the memory cells are adapted to operate with write cycles that are faster than can be accomplished using cells not subject to the pre-stress process.

A method for manufacturing an integrated circuit as described herein includes providing electrodes, and memory elements contacting surfaces of the electrodes. A pre-stress process, including applying a forming pulse, is executed so that the cells have faster operating speeds.

An integrated circuit as described herein comprises a plurality of memory cells on a substrate. A controller on the integrated circuit is adapted to apply biasing operations to target memory cells that establish a pre-stress condition, and to operate the memory cells on the device with write speeds that depend on the pre-stress condition applied. Thus, at least some of the memory cells can be subjected to a pre-stress process that alters the set speed of the cells in the array. As a result of the pre-stress process, the memory cells are adapted to operate with write cycles that are faster, for example, than can be accomplished using cells not subject to the pre-stress process.

An integrated circuit as described herein comprises a plurality of memory cells on a substrate. The plurality of memory cells comprises a first set of memory cells comprising a programmable resistance memory material, and a second set of memory cells comprising the programmable resistance memory material, where at least one of the first and second sets of memory cells has been subjected to a pre-stress process that alters the set speed of the cells in the array so that said characteristic is different in the first set than in the second set. As a result of the pre-stress process, the first and second sets of memory cells have different properties such that the first and second sets of memory cells have different operational memory characteristics.

Sets of memory cells as described herein comprising memory materials having different properties as part of an SOC or other integrated circuit device result in the sets of memory cells providing different operational characteristics such as switching speed, cycle endurance, and data retention on the same chip. The sets of memory cells can address the different memory performance requirements such as those demanded of the various mission functions of SOCs on a single integrated circuit.

Other aspects and advantages of the present invention can be seen on review of the drawings, the detailed description and the claims, which follow.

DETAILED DESCRIPTION

A detailed description of embodiments of new memory technology is provided with reference to FIGS. 1-22.

Figure 1:
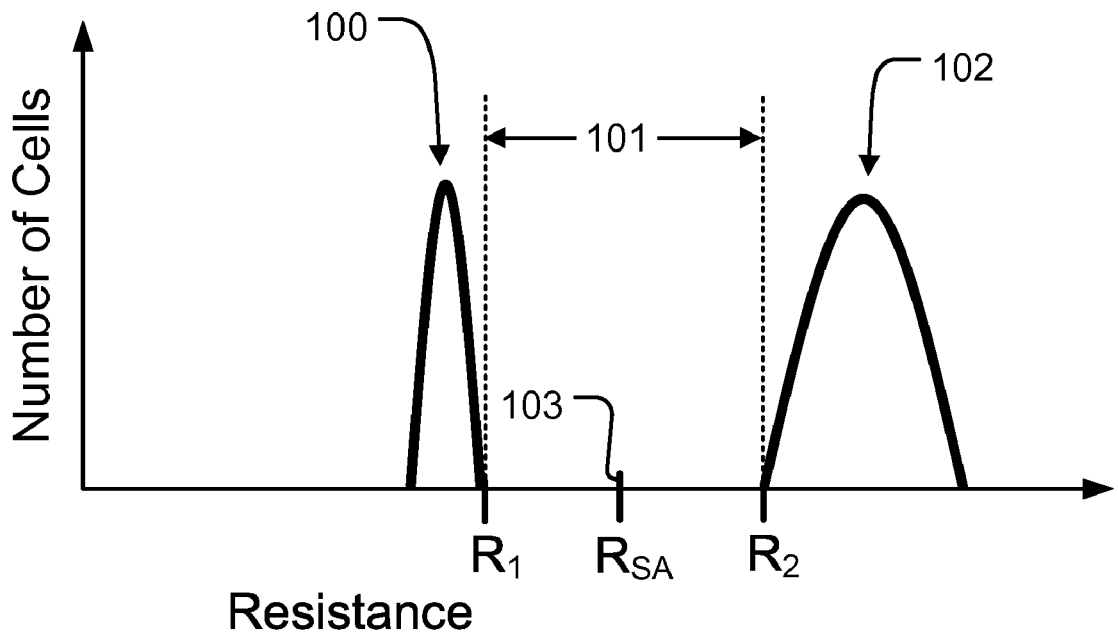
FIG. 1 is a graph showing resistance distributions for memory states in prior art phase change memory cells.

In phase change memory, data is stored by causing transitions in an active region of the phase change material between amorphous and crystalline phases, which have significantly different resistances. FIG. 1 is a graph of resistance distributions for memory states in memory cells storing a single bit of data, including a low resistance set (programmed) state 100 corresponding to a primarily crystalline phase in the active region of the cell, and a high resistance reset (erased) state 102 corresponding to a primarily amorphous phase in the active region of the cell. For reliable operation, the resistance distributions must have non-overlapping resistance ranges.

The difference between the highest resistance $R_1$ of the set state 100 and the lowest resistance $R_2$ of the reset state 102 defines a read margin 101 used to distinguish cells in the set state 100 from those in the reset state 102. The data stored in a memory cell can be determined by measuring whether the resistance of the memory cell is above or below a threshold resistance value $R_{SA}$ 103 within the read margin 101. In multiple bit-per-cell embodiments, there are more than two resistance states with read margins between them.

In order to reliably distinguish between the reset state 102 and the set state 100, it is important to maintain a relatively large read margin 101. Sensing circuitry on the cell is designed to operate within the read margins defined, and more narrow margins require more complex circuitry and can result in slower read processes. Also, set and reset pulses are designed based on the resistance distributions within the set and reset states. Wider distributions of resistance with the set state for example result in variations in the amount of time, or in the amount of power needed to cause a phase transition to the amorphous state, and vice versa.

Figure 2:
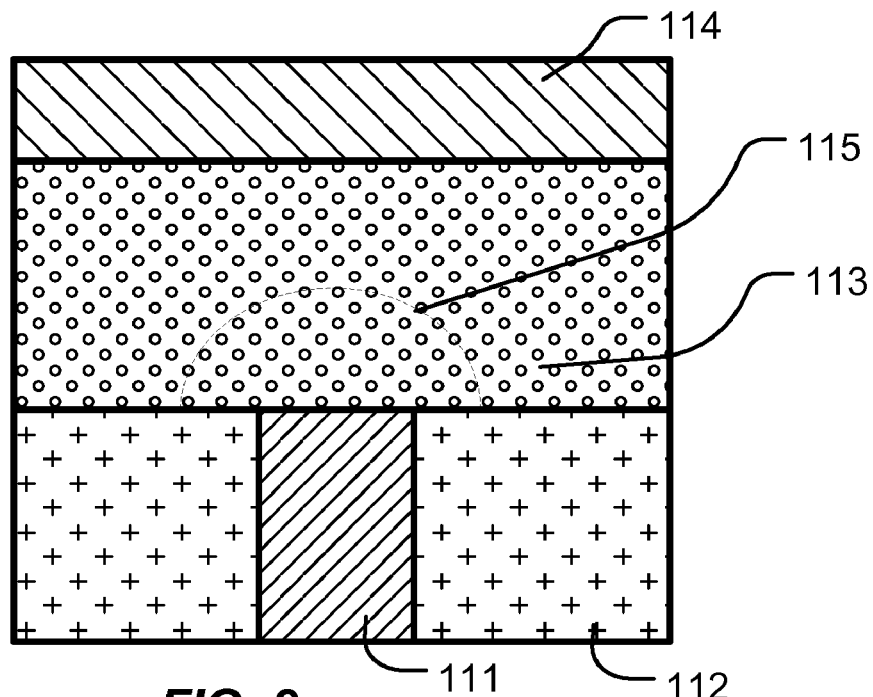
FIG. 2 shows basic structure of a prior art phase change memory cell.

FIG. 2 illustrates a prior art "mushroom type" memory cell having a first electrode 111 extending through dielectric 112, a memory element 113 comprising a body of phase change material, and a second electrode 114 on the memory element 113. The first electrode 111 is coupled to a terminal of an access device (not shown) such as a diode or transistor, while the second electrode 114 is coupled to a bit line and can be part of the bit line (not shown). The first electrode 111 has a width less than the width of the second electrode 114 and memory element 113, establishing a small contact area between the body of phase change material and the first electrode 111 and a relatively larger contact area between the body of phase change material and the second electrode 114, so that higher current densities are achieved with small absolute current values through the memory element 113. Because of this smaller contact area at the first electrode 111, the current density is largest in operation in the region adjacent the first electrode 111, resulting in the active region 115 having a "mushroom" shape as shown in the Figure. In the memory cell illustrated, the bulk stoichiometry of the body of phase change material is uniform inside and outside the active region 115.

Figure 3:
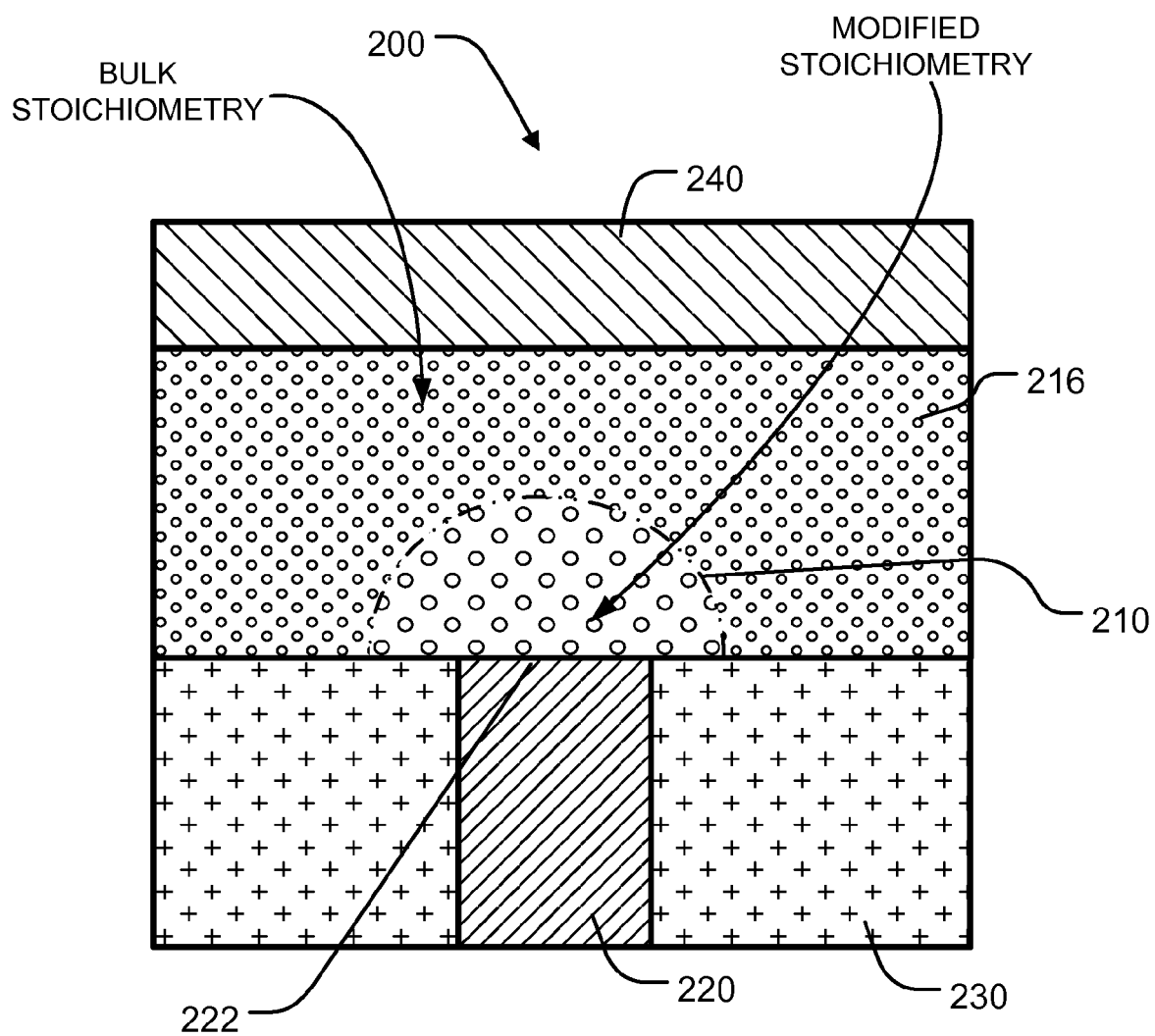
FIG. 3 illustrates structure of a memory cell with a body of phase change material having a been adapted by a pre-stress operation to increase the set speed.

FIG. 3 illustrates a memory cell 200 including a first electrode 220 extending through dielectric 230 to contact a bottom surface of the memory element 216, and a second electrode 240 on the memory element 216, the memory element 216 consisting of a body of phase change material. The body of phase change material in the memory element 216 has a bulk stoichiometry outside the active region 210 and for some embodiments, a modified stoichiometry inside the active region, where the modified stoichiometry is different than the bulk stoichiometry. The electrical pre-stress operations described herein cause a shift in set speed.

The first and second electrodes 220, 240 may comprise, for example, TiN or TaN. Alternatively, the first and second electrodes 220, 240 may each be W, WN, TiAlN or TaAlN, or comprise, for further examples, one or more elements selected from the group consisting of doped-Si, Si, C, Ge, Cr, Ti, W, Mo, Al, Ta, Cu, Pt, Ir, La, Ni, N, O, and Ru and combinations thereof.

In the illustrated embodiment the dielectric 230 comprises SiN. Alternatively, other dielectric materials, such as silicon oxides, may be used.

The phase change material of memory element 216 in this example comprises $Ge_xSb_yTe_z$ material doped with 10 to 20 atomic percent (at %) silicon oxide, wherein for the bulk stoichiometry x=2, y=2 and z=5. For the modified stoichiometry in the active region, x=2, y=4 and z=4, within rounding error for one significant bit, for this example cell.

Other chalcogenides and phase change alloy materials may be used as well. As can be seen in the Figures, the contact surface 222 between the first electrode 220 and the body of phase change material has a width (which in some embodiments is a diameter) less than that of the memory element 216 and top electrode 240. Thus, current is concentrated in the portion of the memory element 216 adjacent the first electrode 220, resulting in the active region 210 as shown, in which the phase change kinetics are confined during operation. The memory element 216 also includes an inactive region outside the active region 210. Using this material, the inactive region remains in a polycrystalline state with small grain size.

The active region 210 comprises phase change material domains within a dielectric-rich mesh (not shown), caused by separation of the silicon oxide doping from the phase change alloy, as described in detail in U.S. patent application entitled DIELECTRIC MESH ISOLATED PHASE CHANGE STRUCTURE FOR PHASE CHANGE MEMORY, application Ser. No. 12/286,874, referred to above.

Figure 4:
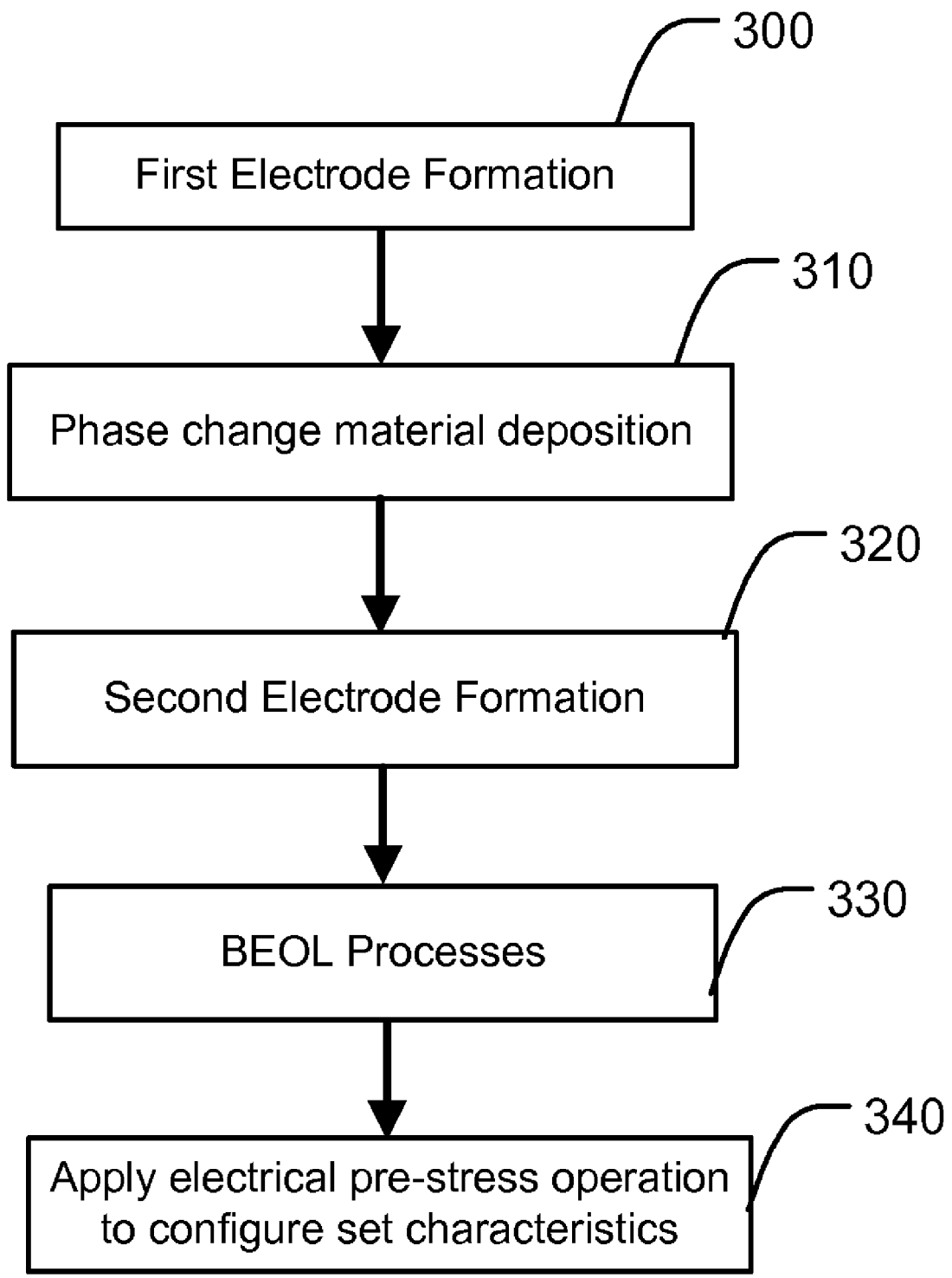
FIG. 4 is a simplified flowchart of a manufacturing process described herein.

FIG. 4 illustrates a process flow diagram of a manufacturing process for manufacturing a memory cell as shown in FIG. 3.

At step 300 the first electrode 220 having a contact surface 222 is formed, extending through dielectric 230. In the illustrated embodiment the first electrode 220 comprises TiN and the dielectric 230 comprises SiN. In some embodiments the contact surface 222 of the first electrode 220 has a sublithographic width or diameter.

The first electrode 220 extends through dielectric 230 to underlying access circuitry (not shown). The underlying access circuitry can be formed by standard processes as known in the art, and the configuration of elements of the access circuitry depends upon the array configuration in which the memory cells described herein are implemented. Generally, the access circuitry may include access devices such as FET or bipolar transistors and diodes, word lines and sources lines, conductive plugs, and doped regions within a semiconductor substrate.

The first electrode 220 and the dielectric 230 can be formed, for example, using methods, materials, and processes as disclosed in U.S. patent application Ser. No. 11/764,678 filed on 18 Jun. 2007, now Publication No. US2008-0191187 published on 14 Aug. 2008, entitled "Method for Manufacturing a Phase Change Memory Device with Pillar Bottom Electrode", which is incorporated by reference herein. For example, a layer of electrode material can be formed on the top surface of access circuitry (not shown), followed by patterning of a layer of photoresist on the electrode layer using standard photolithographic techniques so as to form a mask of photoresist overlying the location of the first electrode 220. Next, the mask of photoresist is trimmed using, for example, oxygen plasma to form a mask structure having sublithographic dimensions overlying the location of the first electrode 220. Then, the layer of electrode material is etched using the trimmed mask of photoresist, thereby forming the first electrode 220 having a sublithographic diameter. Next dielectric 230 is formed and planarized.

At step 310, a body of phase change material having a bulk stoichiometry (e.g. doped $Ge_2Sb_2Te_5$ material having 10 to 20 at % silicon oxide) is deposited on the first electrode 220 and dielectric 230. The deposition of $Ge_2Sb_2Te_5$ and silicon oxide may be carried out by co-sputtering of a GST target with for one example, a DC power of 10 Watts and an $SiO_2$ target with an RF power of 10 to 115 Watts in an argon atmosphere. Other processes may be used as suits a particular phase change material and memory cell structure.

An optional annealing (not shown) can be performed to crystallize the phase change material. In the illustrated embodiment the thermal annealing step is carried out at 300° C. for 100 seconds in a nitrogen ambient. Alternatively, since subsequent back-end-of-line processes performed to complete the device may include high temperature cycles and/or a thermal annealing step depending upon the manufacturing techniques used to complete the device, in some embodiments the annealing may be accomplished by following processes, and no separate annealing step is added to the manufacturing line.

Next, at step 320 a second electrode 240 is formed, resulting in the structure illustrated in FIG. 4. In the illustrated embodiment the second electrode 240 comprises TiN.

Figure 18:
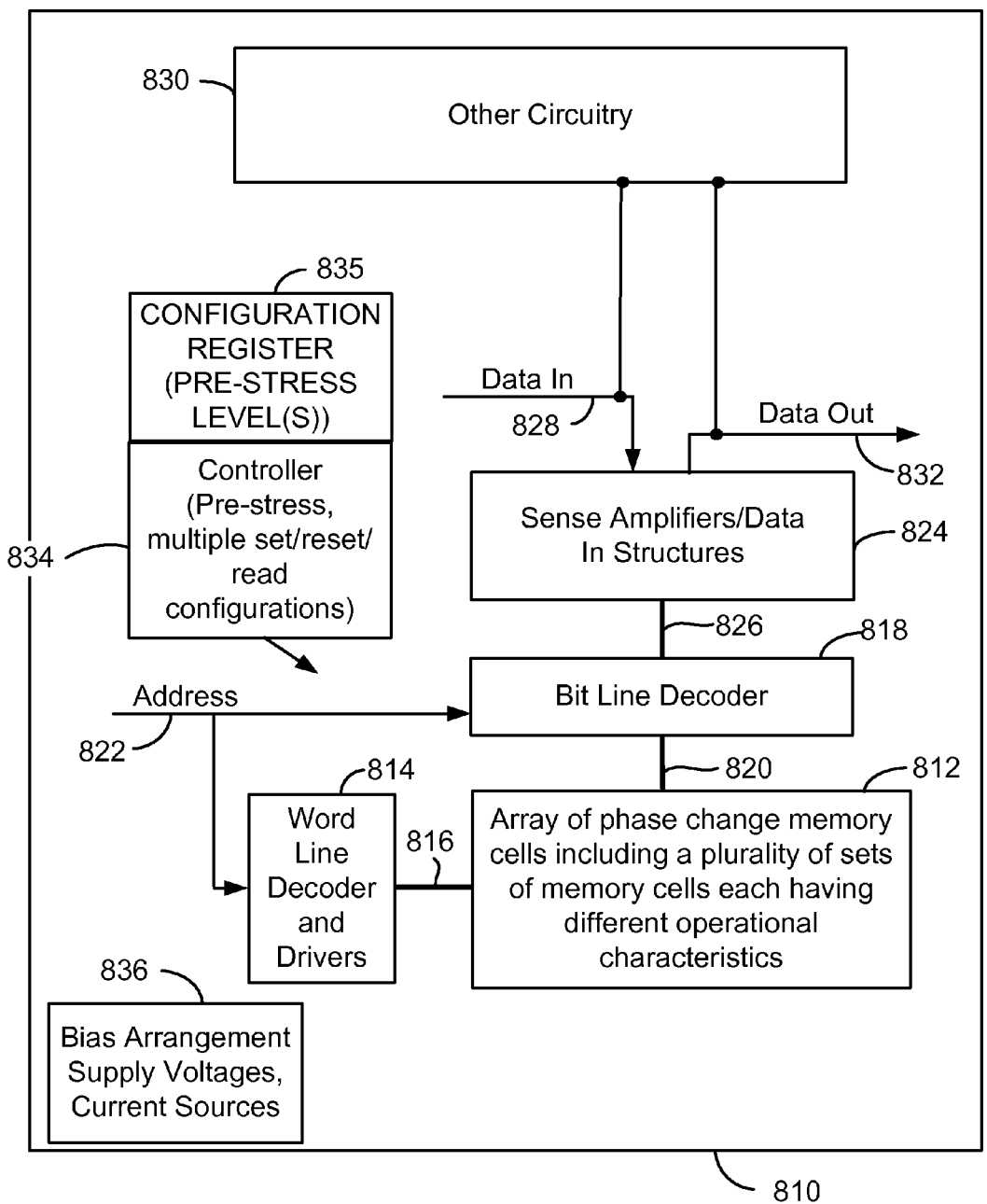
FIG. 18 is a simplified block diagram of an integrated circuit memory device including phase change memory cells as described herein.

Next, at step 330 back-end-of-line (BEOL) processing is performed to complete the semiconductor process steps of the chip. The BEOL processes can be standard processes as known in the art, and the processes performed depend upon the configuration of the chip in which the memory cell is implemented. Generally, the structures formed by BEOL processes may include contacts, inter-layer dielectrics and various metal layers for interconnections on the chip including circuitry to couple the memory cell to peripheral circuitry. These BEOL processes may include deposition of dielectric material at elevated temperatures, such as depositing SiN at 400° C. or high density plasma HDP oxide deposition at temperatures of 500° C. or greater. As a result of these processes, control circuits and biasing circuits as shown in FIG. 18 are formed on the device, including in some embodiments circuitry for applying electrical pre-stress operations as described below.

Next, at step 340, electrical pre-stress operations are applied to target memory cells in the array. The electrical pre-stress operations can include forming pulses applied using on-chip control circuits and bias circuits. Thus, the control circuits and bias circuits may be implemented to execute the electrical pre-stress operations. In yet another alternative, the electrical pre-stress operations may be executed using equipment in the manufacturing line that connects to the chips during manufacture, such as test equipment, to set voltage magnitudes and pulse heights.

FIGS. 5-13 illustrate a variety of pulse shapes for the pre-stress operations which can be applied in various embodiments.

Figures 5, 6, 7, 8, 9, 10, 11, 12, 13:
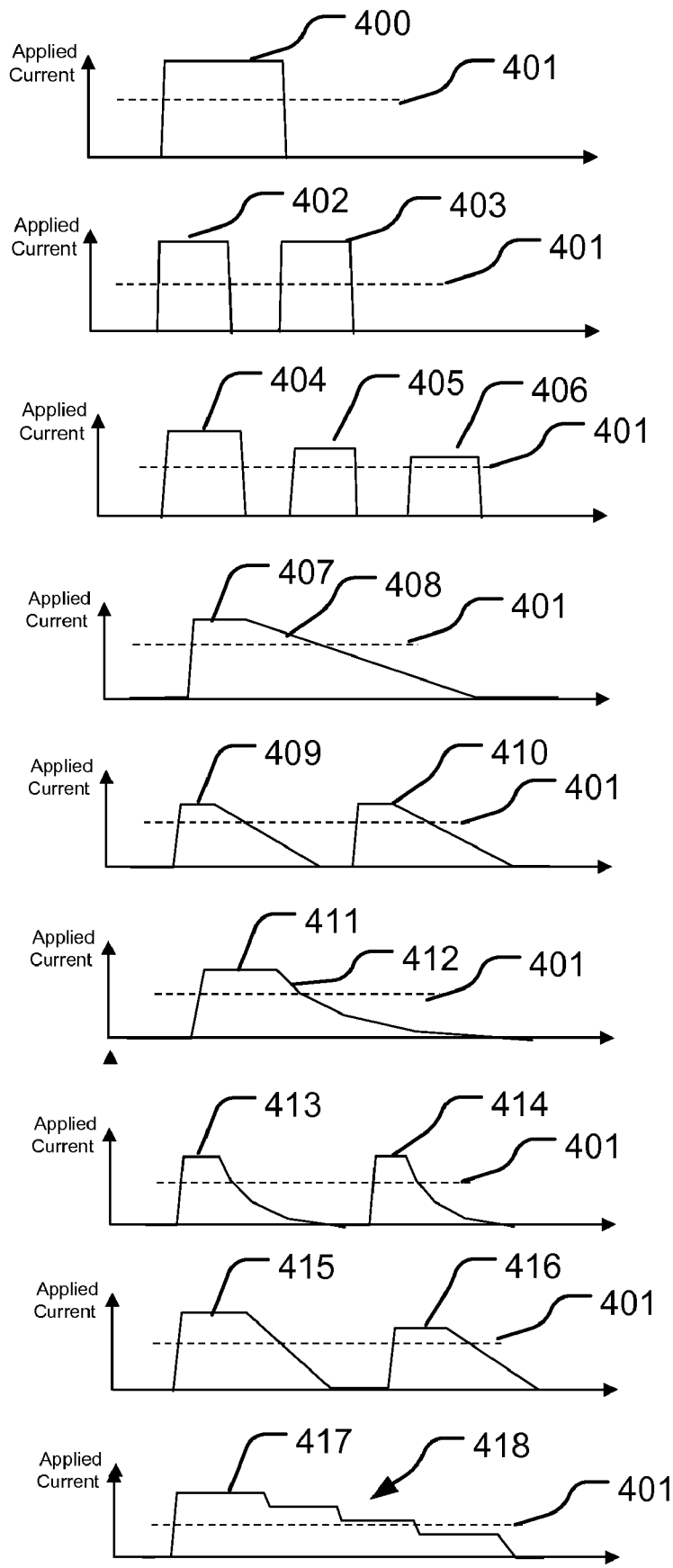
FIGS. 5-13 illustrate alternative pulse shapes for forming current used in the manufacturing process described in FIG. 4.

In FIG. 5, a single square pulse 400 of relatively long duration and rapid rising and falling edges is applied, with peak amplitude above a phase segregation threshold 401 for the phase change material to cause a cumulative duration in the high temperature phase sufficient for changing the operational characteristics of the memory cells. A representative phase segregation threshold can be about 100 microAmps, although the level depends on the cell structure, including bottom electrode contact area, and pulse durations. Representative pulse widths can range from about 0.5 millisecond to over 200 milliseconds, depending upon the materials used, the configuration of the memory cell, the number of memory cells in the array, the specified life of the cell in number of set/reset cycles, and other factors. The amplitudes and pulse widths utilized can be determined empirically, for a given embodiment, and provide sufficient power to cause segregation of the phase change material and the dopant.

FIG. 6 shows that the forming current can be applied as a sequence of square pulses 402, 403 which cause a cumulative duration in the high temperature phase sufficient for formation of the modified stoichiometry in the active region.

FIG. 7 shows that the forming current can be applied as a sequence of square pulses 404, 405, 406 having stepped down magnitudes, which cause a cumulative duration in the high temperature phase sufficient for set speed adjustment. The stepped down magnitudes may prevent formation of interfacial layers and localized anomalies in the structure.

FIG. 8 shows that the forming current can be applied as a single pulse 407 with a rapid rising edge and a ramp-shaped trailing edge or tail 408 of constant or near constant slope, which causes a cumulative duration in the high temperature phase sufficient for set speed adjustment. The tail 408 of the forming pulse can let the atoms move more gently without a sudden stop (quench), thus preventing the forming of an interface layer in the active region. For pulses having a fast trailing edge which ramps to zero in an interval shorter than a quench cutoff, the fast trailing edge could be considered as a "quench" which results in the material solidifying in the active region in the amorphous phase. This quench cutoff is about 10 nanoseconds in a phase change material based on $Ge_2Sb_2Te_5$, and will be different for different phase change materials. In the embodiment shown in FIG. 9, the trailing edge ramps for a time interval significantly greater than the quench cutoff, e.g. more that twice the quench cutoff, and can be 5 to 10 times longer, or more.

FIG. 9 shows that the forming current can be applied as a sequence of pulses 409, 410 having sloped trailing edges with relatively long tails of constant or near constant slope, which cause a cumulative duration in the high temperature phase sufficient for set speed adjustment. For a pulse having a peak current sufficient to cause a temperature in the active region over the phase segregation threshold for a first duration for the phase change material, the sloped trailing edge in which the current magnitude drops over a time interval significantly greater than the quench cutoff, in this example can reduce interface formation within the body of phase change materials.

FIG. 10 shows that the forming current can be applied as a single pulse 411 with a rapid rising edge and a ramp-shaped, or sloped, trailing edge or tail 412 of changing slope, going from a relatively high negative slope to a slope close to zero over the length of the trailing edge, which causes a cumulative duration in the high temperature phase sufficient for set speed adjustment. For a pulse having a peak current sufficient to cause a temperature in the active region over the phase segregation threshold for a first duration for the phase change material, the sloped trailing edge in which the current magnitude drops over a time interval greater than the quench cutoff, in this example can reduce interface formation within the body of phase change materials.

FIG. 11 shows that the forming current can be applied as a sequence of pulses 413, 414 having ramped trailing edges with relatively long tails of changing slope, which cause a cumulative duration in the high temperature phase sufficient for set speed adjustment. Each pulse in the sequence, or only a final pulse in the sequence can be characterized by having a peak current sufficient to cause a temperature in the active region over the phase segregation threshold for a first duration for the phase change material, and a sloped trailing edge in with the current magnitude drops over a time interval significantly greater than the quench cutoff.

FIG. 12 shows that the forming current can be applied as a sequence of pulses 415, 416 with amplitudes stepping down, and having sloped trailing edges with relatively long tails of constant or near constant slope, which cause a cumulative duration in the high temperature phase sufficient for set speed adjustment. Each pulse in the sequence, or only a final pulse in the sequence can be characterized by having a peak current sufficient to cause a temperature in the active region over the phase segregation threshold for a first duration for the phase change material, and a sloped trailing edge in with the current magnitude drops over a time interval significantly greater than the quench cutoff.

FIG. 13 shows that the forming current can be applied as a single pulse 417 with a rapid rising edge and a sloped trailing edge implemented by a stepping down trailing edge or tail 418, which causes a cumulative duration in the high temperature phase sufficient for set speed adjustment.

FIGS. 5-13 show a variety of pulse shapes for forming current. The phase segregation threshold can be exceeded by a higher magnitude, shorter duration pulse or pulse sequence, or a shorter magnitude, longer duration pulse or pulse sequence, as suits a particular implementation. Of course, other pulse formats and pulse sequences can be applied to achieve the result of causing for set speed adjustment. By applying larger stress current or longer stress time to apply the energy necessary to induce the change in behavior to the cell, the initial performance can be changed to high-speed performance. Stepped pulses, constant magnitude pulses, pulse strings and so on can be applied to induce the necessary change. The actual pulse shapes and energies applied can be determined empirically, and depend on the phase change material, the dopants, and cell configuration, the desired effects and so on.

Figure 14:
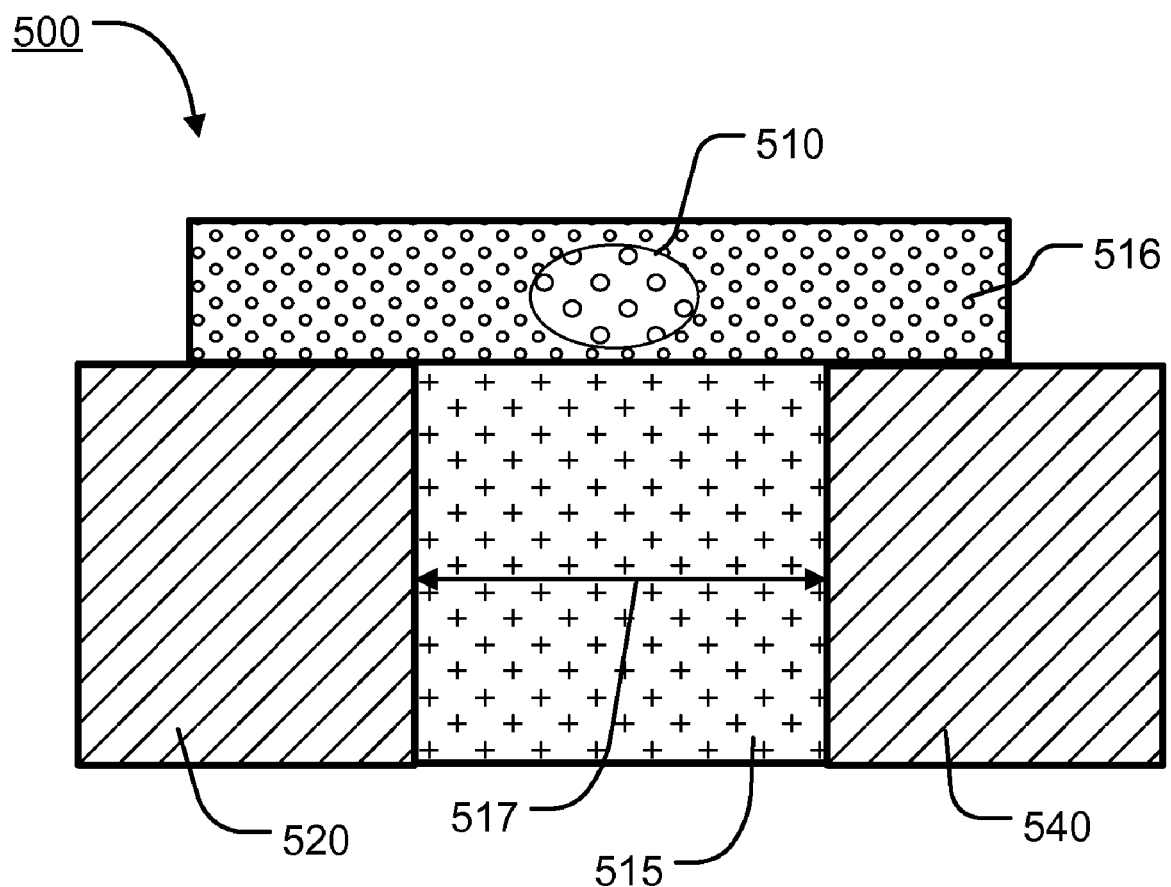
FIG. 14 illustrates a bridge type memory cell structure using a phase change material with a dielectric mesh in the active region as described herein.
Figure 15:
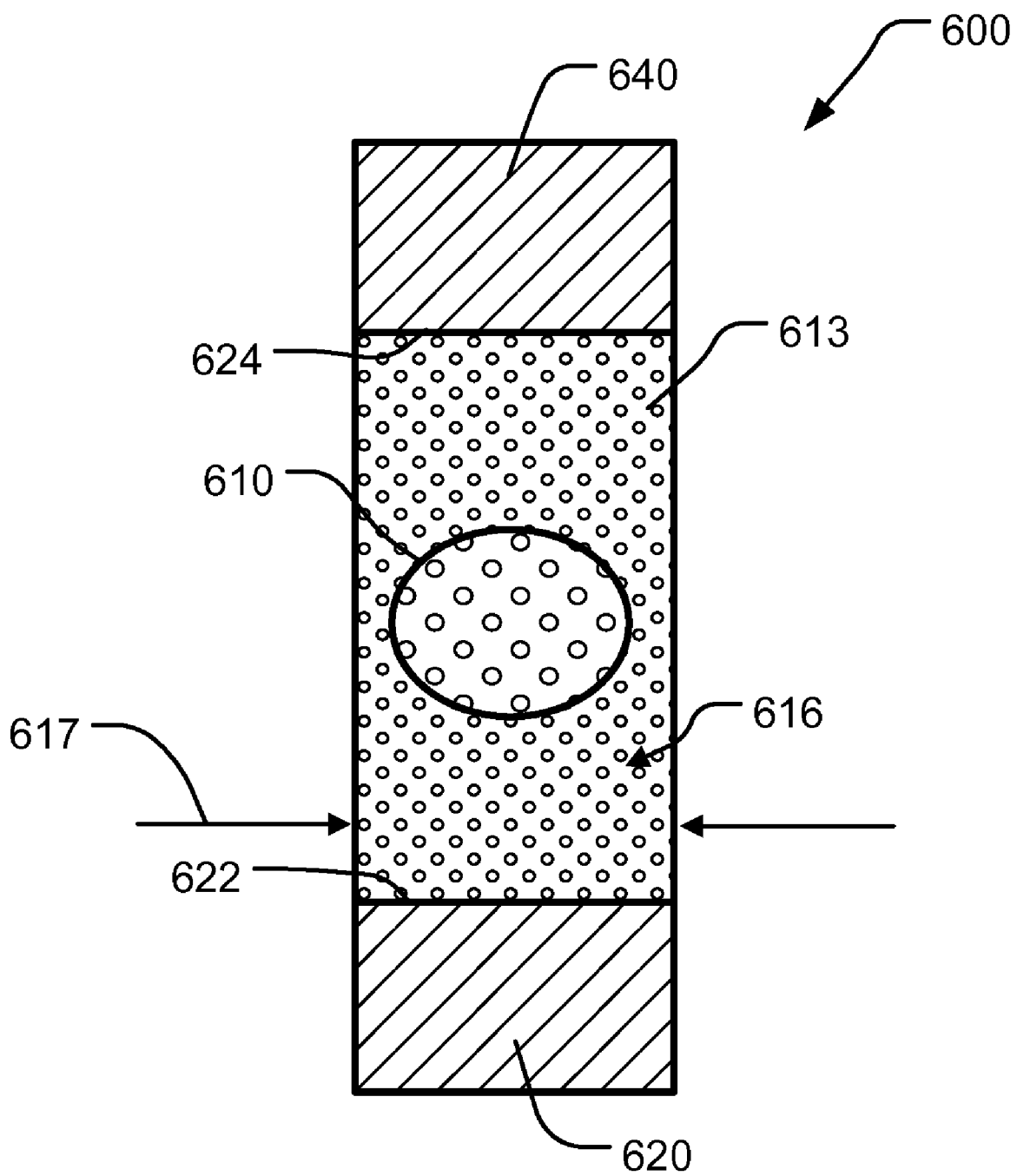
FIG. 15 illustrates an "active in via" type memory cell structure using a phase change material with a dielectric mesh in the active region as described herein.
Figure 16:
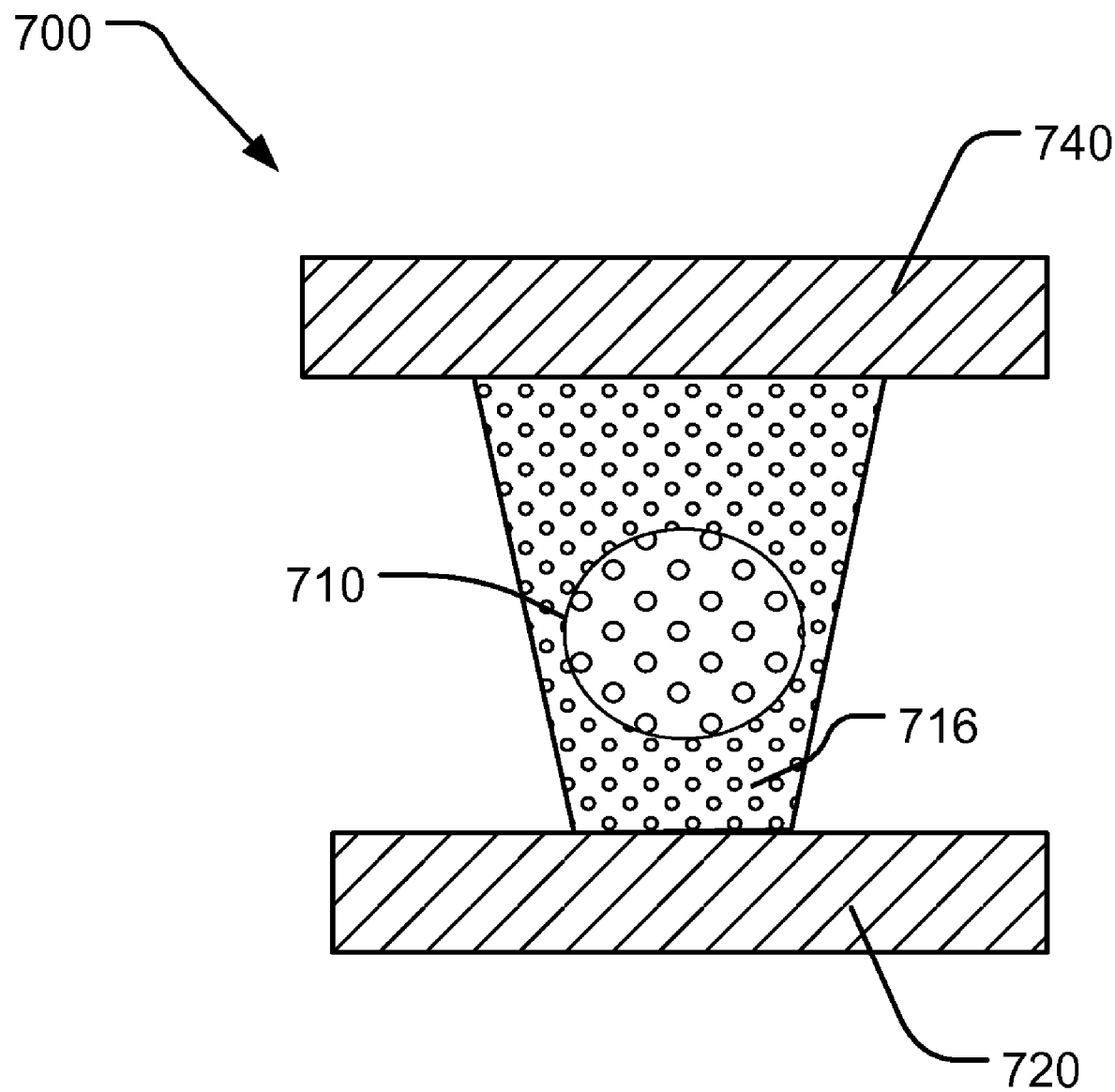
FIG. 16 illustrates a pore-type memory cell structure using a phase change material with a dielectric mesh in the active region as described herein.

FIGS. 14-16 illustrate memory cells that comprise a body of phase change material having a bulk stoichiometry, with an active region having a modified stoichiometry. The materials described above with reference to the elements of FIGS. 2 and 4 may be implemented in the memory cells of FIGS. 14-16, and thus a detailed description of these materials is not repeated.

FIG. 14 illustrates a cross-sectional view of a second memory cell 500 having a body of phase change material with a bulk stoichiometry forming a bridge type memory element 516, and having an active region 510 with a modified stoichiometry as described above.

The memory cell 500 includes a dielectric spacer 515 separating first and second electrodes 520, 540. The memory element 516 extends across the dielectric spacer 515 to contact the first and second electrodes 520, 540, thereby defining an inter-electrode current path between the first and second electrodes 520, 540 having a path length defined by the width 517 of the dielectric spacer 515. In operation, as current passes between the first and second electrodes 520, 540 and through the memory element 516, the active region 510 heats up more quickly than the remainder of the memory element 516.

FIG. 15 illustrates a cross-sectional view of a third memory cell 600 having a body of phase change material with a bulk stoichiometry forming a pillar-shaped memory element 616, and having an active region 610 with a modified stoichiometry as described above.

The memory cell 600 includes a pillar-shaped memory element 616 contacting first and second electrodes 620, 640 at top and bottom surfaces 622, 624, respectively. The memory element 616 has a width 617 substantially the same in this example, as that of the first and second electrodes 620, 640 to define a multi-layer pillar surrounded by dielectric (not shown). As used herein, the term "substantially" is intended to accommodate manufacturing tolerances. In operation, as current passes between the first and second electrodes 620, 640 and through the memory element 616, the active region 610 heats up more quickly than the remainder 613 of the memory element.

FIG. 16 illustrates a cross-sectional view of a fourth memory cell 700, a body of phase change material with a bulk stoichiometry forming a pore-type memory element 716, and having an active region 710 with a modified stoichiometry as described above.

The memory cell 700 includes a pore-type memory element 716 surrounded by dielectric (not shown) contacting first and second electrodes 720, 740 at top and bottom surfaces, respectively. The memory element has a width less than that of the first and second electrodes, and in operation as current passes between the first and second electrodes and through the memory element the active region heats up more quickly than the remainder of the memory element.

As will be understood, the present invention is not limited to the memory cell structures described herein and generally includes memory cells including a body of phase change material having a bulk stoichiometry, and having an active region modified by forming pulses for set speed adjustment.

Figure 17:
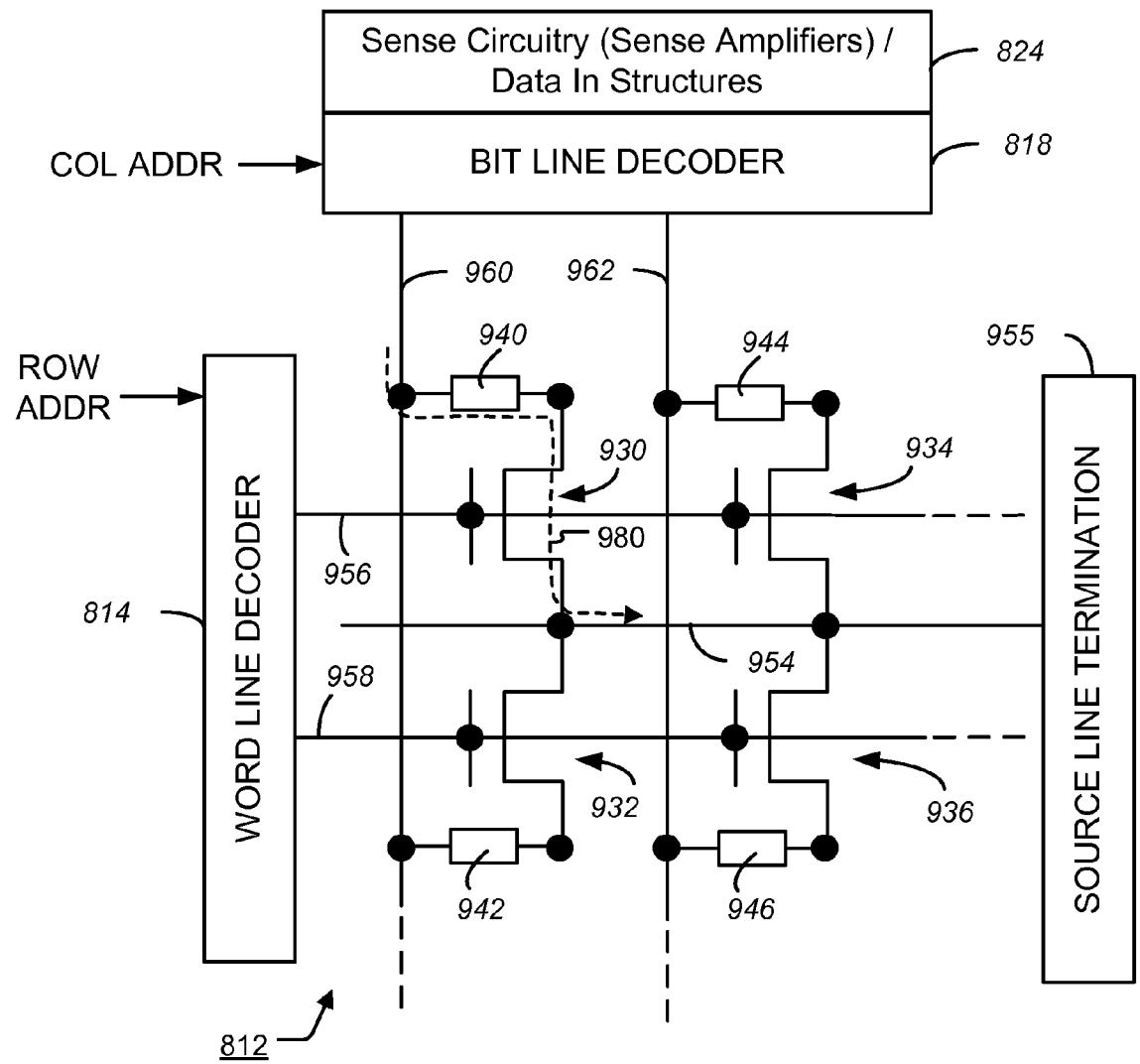
FIG. 17 is a simplified circuit diagram of a memory array including phase change memory cells as described herein.

In FIG. 17 four memory cells 930, 932, 934, 936 having pre-stressed memory elements 940, 942, 944, 946 are illustrated, representing a small section of an array.

Sources of each of the access transistors of memory cells 930, 932, 934, 936 are connected in common to source line 954 that terminates in a source line termination circuit 955, such as a ground terminal. In another embodiment the source lines of the access devices are not shared between adjacent cells, but are independently controllable. The source line termination circuit 955 may include bias circuitry such as voltage sources and current sources, and decoding circuits for applying bias arrangements, other than ground, to the source line 954, in some embodiments.

A plurality of word lines including word lines 956, 958 extend in parallel along a first direction. Word lines 956, 958 are in electrical communication with word line decoder 814. The gates of access transistors of memory cells 930 and 934 are connected to word line 956, and the gates of access transistors of memory cells 932 and 936 are connected in common to word line 958.

A plurality of bit lines including bit lines 960, 962 extend in parallel in a second direction and are in electrical communication with bit line decoder 818. In the illustrated embodiment each of the memory elements are arranged between the drain of the corresponding access device and the corresponding bit line. Alternatively, the memory elements may be on the source side of the corresponding access device. Control circuitry and biasing circuits (see FIG. 18) are coupled to the array, and provide means for applying forming current to the memory cells for set speed adjustment as described above.

FIG. 18 is a simplified block diagram of an integrated circuit 810 including a memory array 812 implemented using memory cells having an active region comprising phase change domains with a modified stoichiometry within a dielectric-rich mesh as described herein. A word line decoder 814 having read, set and reset modes is coupled to and in electrical communication with a plurality of word lines 816 arranged along rows in the memory array 812. A bit line (column) decoder 818 is in electrical communication with a plurality of bit lines 820 arranged along columns in the array 812 for reading, setting, and resetting the phase change memory cells (not shown) in array 812. Addresses are supplied on bus 822 to word line decoder and drivers 814 and bit line decoder 818. Sense circuitry (Sense amplifiers) and data-in structures in block 824, including voltage and/or current sources for the read, set, and reset modes are coupled to bit line decoder 818 via data bus 826. Data is supplied via a data-in line 828 from input/output ports on integrated circuit 810, or from other data sources internal or external to integrated circuit 810, to data-in structures in block 824. Other circuitry 830 may be included on integrated circuit 810, such as a general purpose processor or special purpose application circuitry, or a combination of modules providing system-on-a-chip functionality supported by array 812. Data is supplied via a data-out line 832 from the sense amplifiers in block 824 to input/output ports on integrated circuit 810, or to other data destinations internal or external to integrated circuit 810.

A controller 834 implemented in this example, using a bias arrangement state machine, controls the bias circuitry voltage and current sources 836 for the application of bias arrangements including read, program, erase, erase verify and program verify voltages and/or currents for the word lines and bit lines. In addition, bias arrangements for applying the forming current are implemented as mentioned above. In the illustrated embodiment, a configuration register is provided on the integrated circuit. The configuration register 835 holds control codes indicating the pre-stress condition of sets of memory cells in the array 812 (or arrays) under the control of the controller 834. The configuration register 835 can be set using typical register write operations in the field, or during manufacturing, to define sets of cells in the array or arrays to be subjected to pre-stress operations, and during read and write operations to select the appropriate operation mode and speed for the corresponding sets of memory cells. Also, the configuration register 835 can store flags indicating the status of pre-stress operations, including a ready state in which the corresponding set of memory cells is usable for mission function memory operations.

Controller 834 may be implemented using special-purpose logic circuitry as known in the art. In alternative embodiments, controller 834 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 834.

The forming pulse and bias circuitry voltage and current sources in block 836 can be implemented using power supply inputs with voltage dividers and charge pumps, current source circuitry, pulse shaping circuitry, timing circuitry and voltage and current switches as are standard in the art.

The controller 834 with the bias circuitry voltage and current sources at block 836 provide a means for applying forming current to pre-stress target memory cells to establish a set speed and other operational characteristics for the device.

In operation, each of the memory cells in the array 812 stores data depending upon the resistance of the corresponding memory element. The data value may be determined, for example, by comparison of current on a bit line for a selected memory cell to that of a suitable reference current by sense amplifiers of sense circuitry (block 824). The reference current can be established so that a predetermined range of currents correspond to a logical "0", and a differing range of current corresponds to a logical "1".

Reading or writing to a memory cell of array 812, therefore, can be achieved by applying a suitable voltage to one of word lines and coupling one of bit lines to a voltage source so that current flows through the selected memory cell. In FIG. 17 an example is shown in which a current path 980 through a selected memory cell (in this example memory cell 930 and corresponding memory element 940) is established by applying voltages to the bit line 960, word line 956, and source line 954 sufficient to turn on the access transistor of memory cell 930 and induce current in path 980 to flow from the bit line 960 to the source line 954, or vice-versa. The level and duration of the voltages applied is dependent upon the operation performed, e.g. a reading operation or a writing operation.

In a reset (or erase) operation of the memory cell, word line decoder 814 facilitates providing a word line with a suitable voltage pulse to turn on the access transistor of the memory cell. Bit line decoder 818 facilitates supplying a voltage pulse to a bit line of suitable amplitude and duration to induce a current to flow though the memory element, the current raising the temperature of the active region of the memory element above the transition temperature of the phase change material and also above the melting temperature to place the phase change material of the active region in a liquid state. The current is then terminated, for example by terminating the voltage pulses on the bit line and on the word line, resulting in a relatively quick quenching time as the active region cools to a high resistance generally amorphous phase in the phase change domains of the active region to establish a high resistance reset state in the memory cell. The reset operation can also comprise more than one pulse, for example using a pair of pulses.

In a set (or program) operation of the selected memory cell, word line decoder 814 facilitates providing a word line with a suitable voltage pulse to turn on the access transistor of the memory cell. Bit line decoder 818 facilitates supplying a voltage pulse to a bit line of suitable amplitude and duration to induce a current to flow through the memory element, the current pulse sufficient to raise the temperature of the active region above the transition temperature and cause a transition in the phase change domains of the active region from the high resistance generally amorphous condition into a low resistance generally crystalline condition, this transition lowering the resistance of all of the memory element and setting the memory cell to the low resistance state.

In a read (or sense) operation of the data value stored in the memory cell, word line decoder 814 facilitates providing a word line with a suitable voltage pulse to turn on the access transistor of the memory cell. Bit line decoder 818 facilitates supplying a voltage to a bit line of suitable amplitude and duration to induce current to flow through the memory element that does not result in the memory element undergoing a change in resistive state. The current on the bit line and through the memory cell is dependent upon the resistance of, and therefore the data state associated with, the memory cell. Thus, the data state of the memory cell may be determined by detecting whether the resistance of the memory cell corresponds to the high resistance state or the low resistance state, for example by comparison of the current on the corresponding bit line with a suitable reference current by sense amplifiers of sense circuitry (block 824).

In a forming pulse or pre-stress mode, the control circuitry in controller 834 and a bias circuitry in block 836 are enabled to execute a procedure for cycling through the array of phase change memory cells, and applying forming current to induce the modification of set speed. The control circuitry can be enabled in representative systems by control signals provided using contact probes with manufacturing equipment in the testing line after separation of the die into individual chips. The control circuitry and a bias circuitry can be enabled in other systems using manufacturing equipment after packaging of the die, using input pads operated in a forming mode which is similar to a testing mode for the chip. In addition, the equipment can be configured to apply forming currents to multiple cells at the same time, so that the total process time for the forming procedure represented by the flow in FIG. 4 can be reduced thus improve the throughput.

The phase change materials used in the embodiment described herein consist of silicon oxide and $G_2S_2T_5$. Other phase change alloys including chalcogenides may be used as well. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference. Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g. U.S. Pat. No. 6,800,504, and U.S. Patent Application Publication No. US 2005/0029502.

Representative chalcogenide material can have a bulk stoichiometry characterized as follows: $Ge_xSb_yTe_z$, where x:y:z=2:2:5. Other compositions can be used with x: 0~5; y: 0~5; z: 0~10. GeSbTe with doping, such as N—, Si—, Ti—, or other element doping, may also be used. These materials can be formed by PVD sputtering or magnetron-sputtering with reactive gases of Ar, $N_2$, and/or He, etc. and chalcogenide at the pressure of 1 mtorr~100 mtorr. The deposition is usually done at room temperature. A collimator with an aspect ratio of 1~5 can be used to improve the fill-in performance. To improve the fill-in performance, the DC bias of several tens of volts to several hundreds of volts is also used. Also, the combination of DC bias and the collimator can be used simultaneously. A post deposition annealing treatment with vacuum or $N_2$ ambient is sometimes needed to improve the crystallized state of chalcogenide material. The annealing temperature typically ranges 100° C. to 400° C. with an anneal time of less than 30 minutes.

The thickness of the chalcogenide material depends on the design of the cell structure. In general, a chalcogenide material with thickness of higher than 8 nm can have a phase change characterization such that the material exhibits at least two stable resistance states, although thinner layers may be suitable for some embodiments.

For memory cells implemented using GST or similar chalcogenides, suitable materials for implementing the electrodes in the illustrated embodiments include TiN, TaN, W and doped Si. Alternatively, the electrodes are TiAlN or TaAlN, or comprise, for further examples, one or more elements selected from the group consisting of Ti, W, Mo, Al, Ta, Cu, Pt, Ir, La, Ni, and Ru and alloys thereof.

The effects of current stressing prior to cell operation have been evaluated for Phase Change Memory (PCM) arrays using doped-$Ge_2Sb_2Te_5$ (doped-GST) material, and shown to provide a method for improving write performance. The doped GST after stressing shows much faster set speed, which is good for increasing the write bandwidth. Physical analysis of the cells after stressing suggests that the faster speed comes from the segregation of GST and the dopants. The segregation does not appear to be permanent and can be removed by a regenerating reset pulse, which is bigger in current amplitude. Write strategies for the cells described herein achieve both better retention and high write bandwidth.

To improve the bandwidth, we evaluated the set performance after applying different current stressing to the doped-GST material. The memory cells used in the test had the structure shown in FIG. 3. The PCM cells after long/large current stressing showed significant improvement in set speed. Using a memory cell configured as shown in FIG. 3, tests were conducted by applying pre-stress current in the form a stepped down pulse having three shapes. In a first test, a six-step-down pulse having a total duration of 6 microseconds was applied, and in a second test, a six-step-down pulse having a total duration of 27 microseconds was applied, and in a third test, a six-step-down pulse having a total duration of 192 microseconds was applied.

Figure 19:
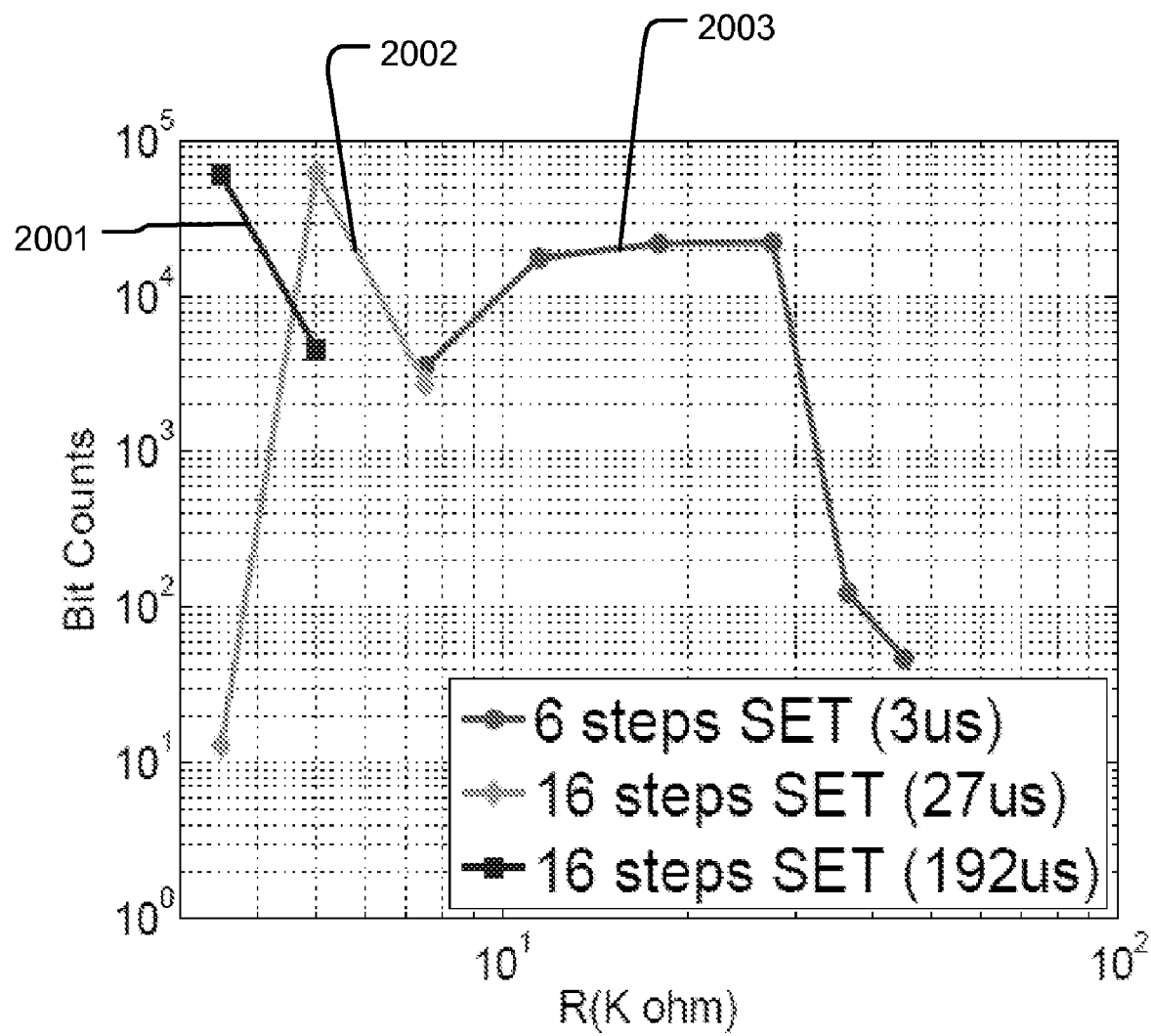
FIG. 19 is a plot showing experimental results as a result of three pre-stress operations, showing set resistance on a logarithmic scale versus bit count for the three operations.

The results of the three tests are shown in FIG. 19, where trace 2001 shows the bit count versus resistance plot for the 192 microsecond pre-stress, trace 2002 shows the plot for the 27 microsecond pre-stress and trace 2003 shows the plot for the 6 microsecond pre-stress. With a longer current stress time and a larger stressing current, the cells achieve lower set resistance. The current stressed cells were then studied by set speed testing and reset transition threshold voltage Vt measurement. For cells receiving 16 steps/192 us current stressing, the crystallization time is reduced to 200-300 ns. This can be compared to the set time for native cells of the same structure which after the normal set operation require about 1 microsecond to crystallize. Meanwhile, the cells after 16 steps/192 us stressing give the lowest Vt, ~1.5V. This is because all the cells after the different current stressing were reset with the same reset current. A given reset current produces a smaller volume of segregated GST, when the cells have a lower dynamic resistance in the set state.

Scanning transition electron microscopy STEM and Electron Energy-Loss Spectroscopy (EELS) were used to analyze the cells after current stressing. The results show doped-GST after the current stressing have the GST and the dopant material segregated. After segregation, the crystallization time is believed to be dominated by the performance of the segregated GST, which has shorter crystallization time than the un-segregated, doped GST, and thus better write bandwidth.

It has been observed therefore that the set speed of phase change memory is determined to a large degree by the manufacturing process, including the structure of the memory cell, and the phase change material chosen for use in the memory cells. As the result, the set speed for an initial condition of a manufactured phase change memory device could be slower than necessary for high-speed mission functions for the memory.

A pre-stress procedure can be applied to change the set speed for target memory cells in a device, as described above. It has been observed that using a pre-stress operation, a set operation speed can be reduced from on the order of one microsecond to less than 300 nsec, or faster.

For a memory mission function requiring good-retention (like that for which flash is often used), electrical stress need not be applied. For a memory function requiring high-speed, like that for which dynamic RAM is often used, and electrical pre-stress can be applied to establish a high-speed write operation.

Figure 20:
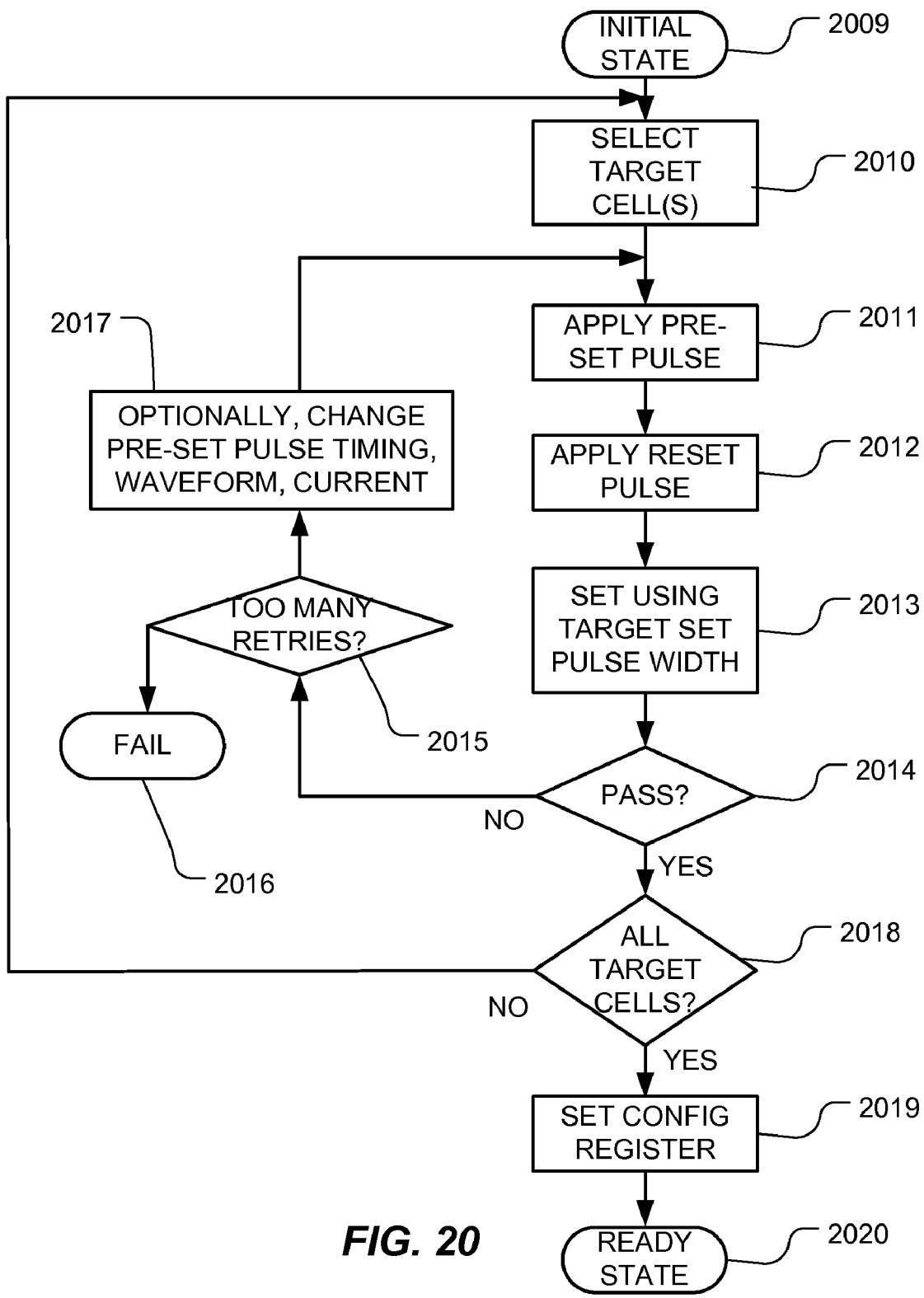
FIG. 20 is a flowchart of a biasing operation which can be applied to pre-stress selected sets of memory cells on an integrated circuit.

FIG. 20 illustrates a pre-stress operation that can be executed using a controller on an integrated circuit like that described with reference to FIG. 18. The operation begins in an initial state (2009). Next, a set of cells that is targeted for a selected mission function is selected (2010). A pre-set pulse having a selected power level as established by its pulse height, pulse width and other characteristics of the pulse shape is applied to the target cells (2011). After the pre-set pulse, a reset pulse is applied (2012). Next, a set operation using the target set pulse width is executed for the target cell or cells (2013). This set pulse width is determined by reading the configuration register or otherwise according to the operating speed selected for the set of target memory cells. After performing the set operation using the target set pulse width, a verify step is executed, such as by reading the contents of the cell determining whether it had been successfully set. As a result of the verify step, the algorithm determines whether the target cell passes the verify operation (2014). If the target cell does not pass, then the algorithm determines whether a maximum retry count has been exceeded (2015). If the retry count is exceeded, then the process failed (2016). If the maximum retry count has not been exceeded, then the process proceeds to apply a subsequent pre-set pulse at step 2011. Optionally, the pre-set pulse timing, waveform or current levels can be adjusted (2017) before the retry operation performed by returning to step 2011.

If at step 2014, the target cell or cells are determined to have passed, then the algorithm determines whether all the target cells on the device have been successfully processed (2018). If there are more cells for processing, then the process returns to step 2010 to select additional target cells. If all of the cells have been successfully processed, then the configuration register is set to indicate that the target cells have been configured for the operating speed characteristics selected for the target set of memory cells (2019). After successfully writing the configuration register, the set of memory cells is ready for operating in the mission function (2020).

Figure 21:
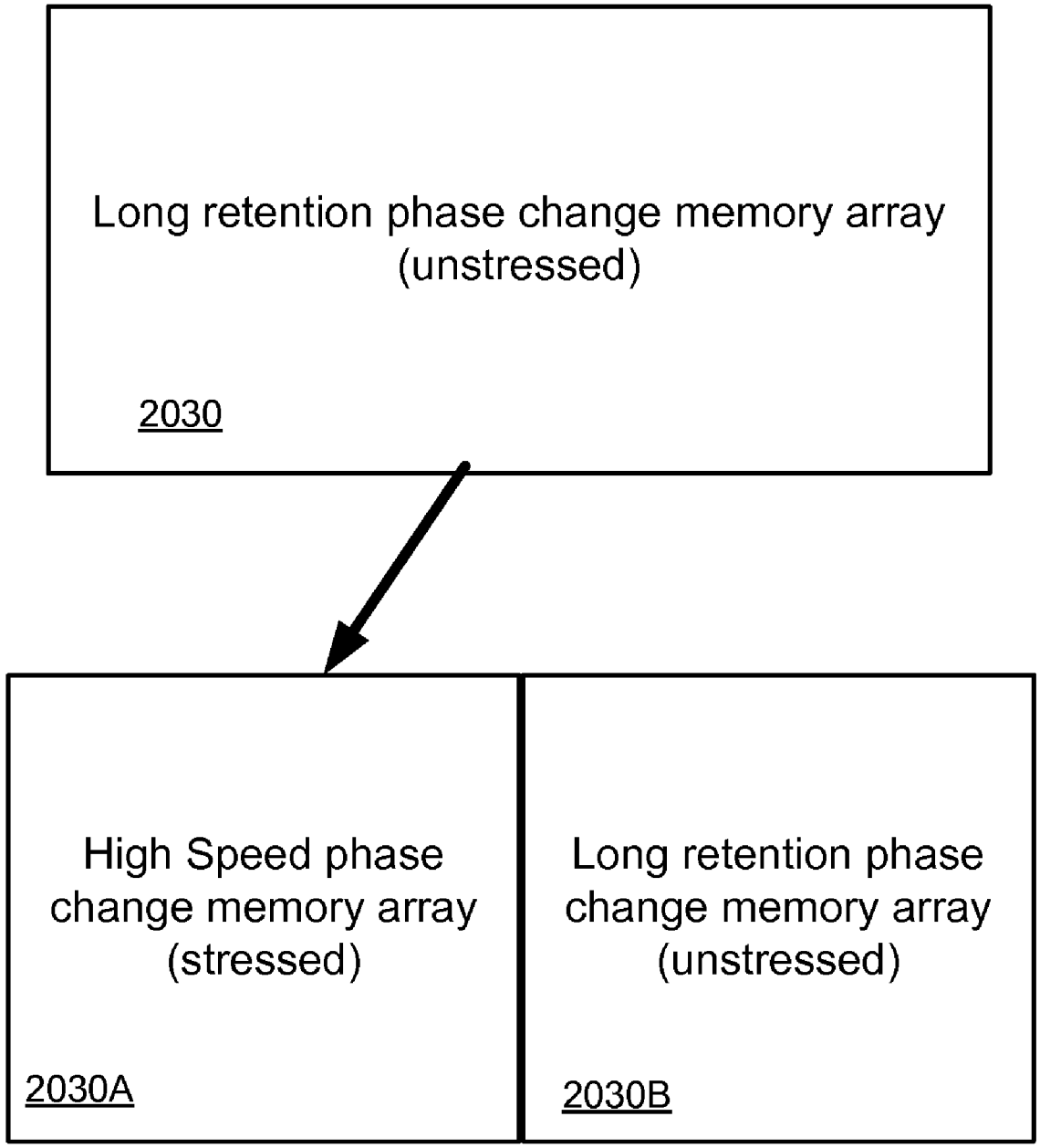
FIG. 21 is a simplified diagram illustrating different zones of pre-stress conditions which can be established using the process of FIG. 20.

As illustrated in FIG. 21, an initial state memory array 2300 can be characterized as having an unstressed condition where the memory cells are characterized by long retention characteristics, for example. The pre-stress operation of FIG. 20 can be applied to one segment of the array. This results in two operating zones (2030A and 2030B) in an array which can be operated for high-speed mission functions and for long retention mission functions, respectively. The zones can be distinguished by having different blocks of addresses in the address space of the array. The zones can be the same size, or more typically different sizes, as suits a particular implementation of the technology.

Figure 22:
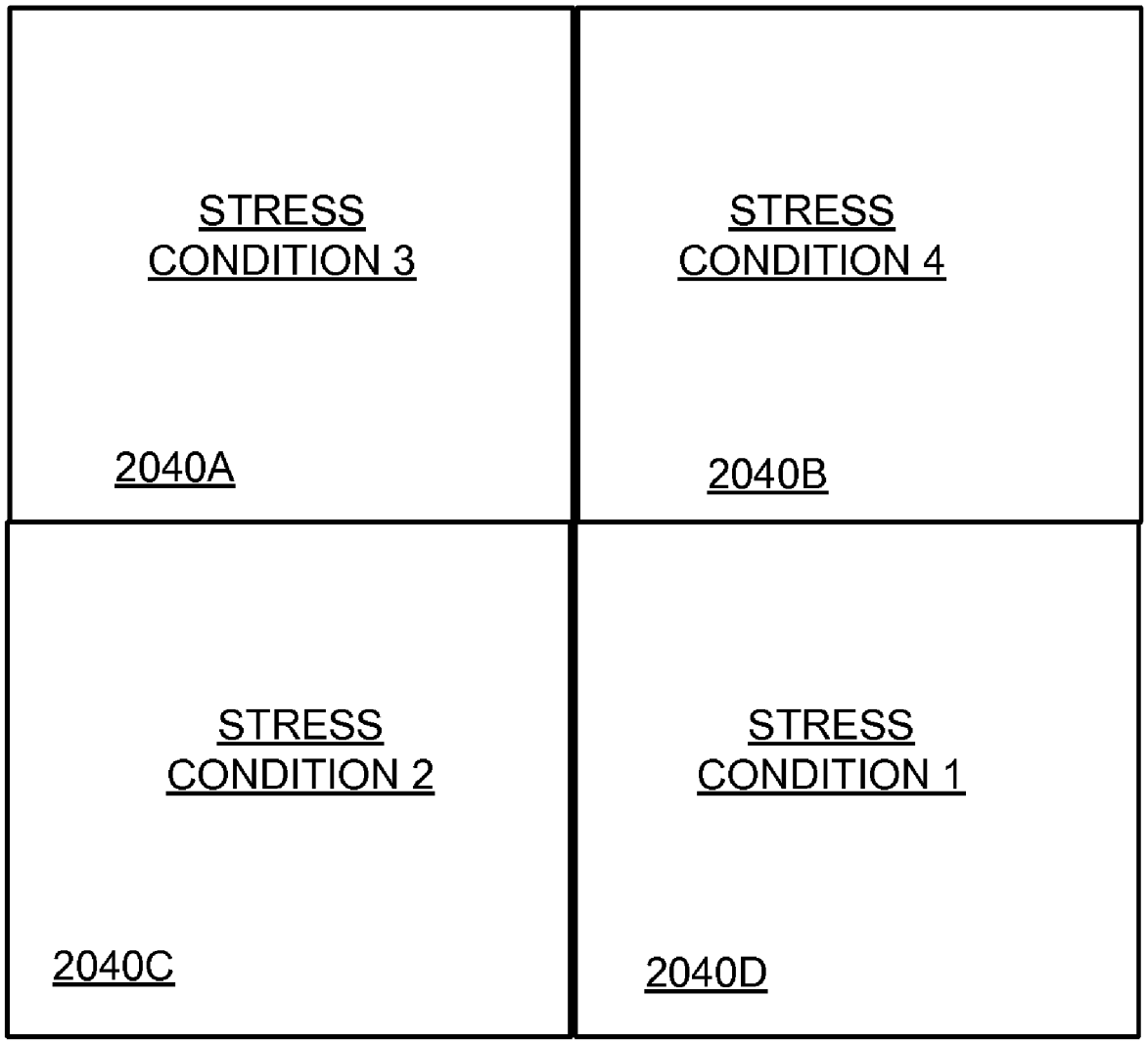
FIG. 22 is a simplified diagram illustrating four zones of pre-stress conditions for a single or multiple array integrated circuit.

FIG. 22 illustrates an example in which an array or multiple arrays on a single integrated circuit can be subjected to multiple stress conditions using an algorithm such as that described with respect to FIG. 20. Thus, for example and without limitation, there are four stress condition zones in the plurality of memory cells represented by the block shown in FIG. 22. Zone 2040A can be pre-stressed so that it is operated in a stress condition 3; zone 2040B can be pre-stressed so that it is operated in a stress condition 4; zone 2040C can be pre-stressed so that it is operated in a stress condition 2; and zone 2040D can be pre-stressed so that it is operated in a stress condition 1. In an alternative, the zones can comprise respective first and second sets of memory cells, where the first set is arranged in a first array at a first location on the substrate; and the second set of memory cells is arranged in a second array at a second location on the substrate and spaced away from the first array, as opposed to having a layout such that the two sets comprise different address spaces in a single physical array.

In one example, the set speed for the zone 2040A can be configured for high speed, for example be less than 50 nsec, and the reset speed can be less than 50 nsec, with short data retention, making the array suitable for some applications usually implemented by DRAM. The operating window for zone 2040A can include a 5 K Ohm maximum resistance for the set state and a 50 K Ohm minimum for the reset state, for example. Zone 2040B can be configured for long retention, with a set speed greater than 300 nsec and a reset speed greater than 50 nsec, making the array suitable for typical non-volatile memory applications. The operating window for zone 2040B can include a 50 K Ohm maximum resistance for the set state and a 5 M Ohm minimum for the reset state. The other zones (2040C and 2040D) can be configured for other operational characteristics. In this way, high speed and good retention can be implemented on a single device, and even within a single array.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit comprising:
   a plurality of memory cells on a substrate, the plurality of the memory cells having memory elements having in common a selected programmable resistance memory material and a common structure; and
   a controller configured to apply biasing operations to target memory cells in the plurality of memory cells, and wherein the biasing operations for target memory cells cause the target memory cells to have selected operational characteristics, and to apply a write process to the target memory cells according to the selected operational characteristics.

2. The integrated circuit of claim 1, wherein the biasing operations include applying a forming pulse to target memory cells in the plurality of memory cells, said forming pulse having a longer duration than pulses applied to set the memory cells in the array that are not target cells.

3. The integrated circuit of claim 1, wherein the biasing operations include an iterative pre-stress operation including applying a pre-stress current pulse to target memory cells, after applying the pre-stress current pulse to a particular memory cell, determining whether the set speed of the particular memory cell meets a target speed, and if not, then applying another pre-stress current pulse to the particular memory cell.

4. The integrated circuit of claim 3, wherein the biasing operations include when performing said step of applying another pre-stress current pulse, using a pre-stress current pulse having a changed value for at least one of pulse length and pulse height than used in a previous iteration.

5. The integrated circuit of claim 1, wherein the programmable resistance memory material comprises a dielectric doped chalcogenide.

6. The integrated circuit of claim 1, wherein the plurality of memory cells includes first and second sets of memory cells arranged in an array, the first set of memory cells at a first location in the array, the second set of memory cells at a second location in the array, and wherein the biasing circuitry is controllable to apply different biasing operations to the first and second sets of memory cells, and to apply different write processes to the first and second sets of memory cells.

7. The integrated circuit of claim 1, wherein the programmable resistance memory material comprises a selected dielectric doped chalcogenide having a base stoichiometry.

8. An integrated circuit comprising a plurality of memory cells on a substrate, the plurality of memory cells comprising:
    a first set of memory cells comprising a programmable resistance memory material;
    a second set of memory cells comprising said programmable resistance memory material modified by an electrical pre-stress operation, the first and second set of memory cells having different set speeds; and
    bias circuitry adapted to apply set operations to target memory cells in the plurality of memory cells, and wherein the set operations for target memory cells in the second set includes a set pulse having shorter duration than set pulses in the set operations for target memory cells in the first set.

9. The integrated circuit of claim 8, wherein the set operations applied to the second set of memory cells include applying said lower power set pulse, and the set operations applied to the first set of memory cells include applying a higher power set pulse.

10. The integrated circuit of claim 8, wherein the first and second sets of memory cells are arranged in an array, the first set of memory cells at a first location in the array, the second set of memory cells at a second location in the array.

11. The integrated circuit of claim 8, wherein:
    the first set of memory cells is arranged in a first array at a first location on the substrate; and
    the second set of memory cells is arranged in a second array at a second location on the substrate and spaced away from the first array.

12. The integrated circuit of claim 8, wherein said programmable resistance memory material comprises a dielectric-doped chalcogenide material.

13. The integrated circuit of claim 8, wherein the plurality of memory cells further comprises a third set of memory cells, the third set of memory cells modified by an electrical pre-stress different from the electrical pre-stress applied to the second set of memory cells.

14. The integrated circuit of claim 8, including bias circuitry on the integrated circuit adapted to apply said electrical pre-stress operation to the second set of memory cells.

15. The integrated circuit of claim 14, wherein the electrical pre-stress operation includes an iterative pre-stress operation including applying a pre-stress current pulse to memory cells in the second set of memory cells, after applying the pre-stress current pulse to a particular memory cell, determining whether the set speed of the particular memory cell meets a target speed, and if not, then applying another pre-stress current pulse to the particular memory cell.

16. A method for manufacturing an integrated circuit, the method comprising:
    forming a plurality of memory cells on a substrate and comprising a selected programmable resistance memory material; and
    applying an electrical pre-stress operation to a set of target cells in the plurality of memory cells, said set not including all of the memory cells in the plurality, to cause the target memory cells to have a shorter duration set interval characteristic.

17. The method of claim 16, wherein the electrical pre-stress operation includes applying a forming pulse to target memory cells in the plurality of memory cells.

18. The method of claim 16, wherein the electrical pre-stress operation includes iteratively applying a pre-stress current pulse to target memory cells, after applying the pre-stress current pulse to a particular memory cell, determining whether the set speed of the particular memory cell meets a target speed, and if not, then applying another pre-stress current pulse to the particular memory cell.

19. The method of claim 18, wherein when performing said step of applying another pre-stress current pulse, using a pre-stress current pulse having a changed value for at least one of pulse length and pulse height than used in a previous iteration.

20. The method of claim 16, wherein the selected programmable resistance memory material comprises a dielectric doped chalcogenide.

21. The method of claim 16, wherein the plurality of memory cells includes first and second sets of memory cells arranged in an array, the first set of memory cells at a first location in the array and including the target cells, the second set of memory cells at a second location in the array, and including applying a different electrical pre-stress to the second sets of memory cells, than said electrical pre-stress operation applied to the target cells.

22. The method of claim 16, wherein the programmable resistance memory material in the first set of memory cells comprises a selected dielectric doped chalcogenide having a base stoichiometry, and the programmable resistance memory material in the second set of memory cells comprises the selected dielectric doped chalcogenide.

23. The method of claim 16, including configuring logic on the integrated circuit to control the electrical pre-stress operation.

* * * * *